(12) United States Patent
Schat et al.

(10) Patent No.: US 11,415,626 B2
(45) Date of Patent: Aug. 16, 2022

(54) METHOD AND APPARATUS COMPRISING A SEMICONDUCTOR DEVICE AND TEST APPARATUS

(71) Applicant: NXP B.V., San Jose, CA (US)

(72) Inventors: Jan-Peter Schat, Hamburg (DE); Abdellatif Zanati, Hamburg (DE); Henrik Asendorf, Hamburg (DE); Maristella Spella, Eindhoven (NL); Waqas Hassan Syed, Eindhoven (NL); Giorgio Carluccio, Eindhoven (NL); Antonius Johannes Matheus de Graauw, Haelen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/118,828

(22) Filed: Dec. 11, 2020

(65) Prior Publication Data

US 2021/0239754 A1 Aug. 5, 2021

(30) Foreign Application Priority Data

Jan. 31, 2020 (EP) .................................. 20154940

(51) Int. Cl.
*G01R 31/311* (2006.01)
(52) U.S. Cl.
CPC ................. *G01R 31/311* (2013.01)
(58) Field of Classification Search
CPC .. G01R 31/311; G01R 1/045; G01R 31/2822; G01S 7/028; G01S 7/4017; G01S 7/4082;

(Continued)

(56) References Cited

U.S. PATENT DOCUMENTS 6,239,669 B1 * 5/2001 Koriyama ............... H01L 23/66
333/247
6,753,516 B1 * 6/2004 Butler .................... H05B 6/708
219/693

(Continued)

OTHER PUBLICATIONS

Chang, L., "An X-band Waveguide Jig for Pre-screening Testing of Fully-integrated Elementary Phased-array Transceiver Antenna-in-package", 2018 Progress In Electromagnetics Research Symposium (PIERS—Toyama), Japan, Aug. 1-4, 2018.

(Continued)

*Primary Examiner* — Jermele M Hollington
*Assistant Examiner* — Courtney G McDonnough

(57) ABSTRACT

A method of testing a semiconductor device. An apparatus comprising a semiconductor device and a test apparatus. The semiconductor device includes an integrated circuit and a plurality of external radiating elements at a surface of the device, the radiating elements include transmit elements and receive elements. The test apparatus includes a surface for placing against the surface of the device. The test apparatus also includes at least one waveguide, which extends through the test apparatus for routing electromagnetic radiation transmitted by one of the transmit elements of the device to one of the receive elements of the device. Each waveguide comprises a plurality of waveguide openings for coupling electromagnetically to corresponding radiating elements of the plurality of radiating elements located at the surface of the device. A spacing between the waveguide openings of each waveguide is larger than, or smaller than a spacing between the corresponding radiating elements.

18 Claims, 10 Drawing Sheets

(58) Field of Classification Search
CPC ... G01S 13/931; H01L 22/12; H01L 23/3121; H01L 23/58; H01L 23/66; H01L 2223/6627; H01L 2223/6677; H01L 2224/131; H01L 2224/16225; H01L 2924/014; H01L 2924/00014; H01Q 3/267; H04B 17/14
USPC .................................................... 324/754.31
See application file for complete search history.

(56) References Cited

U.S. PATENT DOCUMENTS

| | | | |
|---|---|---|---|
| 6,832,081 B1 * | 12/2004 | Hiramatsu | H01Q 13/28 331/117 D |
| 8,918,060 B2 | 12/2014 | Duperray | |
| 9,568,541 B2 | 2/2017 | Trotta | |
| 10,037,933 B2 | 7/2018 | Treibergs et al. | |
| 10,116,399 B2 | 10/2018 | Lehtonen et al. | |
| 2015/0168486 A1 | 6/2015 | Isaac et al. | |
| 2016/0043455 A1 * | 2/2016 | Seler | H04B 5/00 333/26 |
| 2018/0233465 A1 | 8/2018 | Spella et al. | |
| 2019/0198985 A1 | 6/2019 | Seler et al. | |
| 2019/0310314 A1 * | 10/2019 | Liu | G01R 31/3025 |
| 2020/0098710 A1 | 3/2020 | Nair et al. | |

OTHER PUBLICATIONS

Chu, H., "Antenna-in-Package Design and Robust Test for the Link Between Wireless Ingestible Capsule and Smart Phone", Digital Object Identifier 10.1109/ACCESS.2019.2891880, IEEE, Apr. 2019.
Mroczkowski, J., Production Test Interface Solutions for mmWave and Antenna Package (AiP), Chip Scale Review, Jan.-Feb. 2019.
Sarkas, I., "A Fundamental Frequency 143-152 GHz Radar Transceiver with Built-in Calibration and Self-Test", 2012 IEEE Compound Semiconductor Integrated Circuit Symposium, Oct. 14-17, 2012.

* cited by examiner

METHOD AND APPARATUS COMPRISING A SEMICONDUCTOR DEVICE AND TEST APPARATUS

CROSS-REFERENCE TO RELATED APPLICATIONS

This application claims the priority under 35 U.S.C. § 119 of European Patent application no. 20154940.9, filed on 31 Jan. 2020, the contents of which are incorporated by reference herein.

BACKGROUND

The present specification relates to a method of testing a semiconductor device and to an apparatus comprising a semiconductor device and a test apparatus.

Today's Radio Frequency (RF) transceiver Integrated Circuits (ICs) with integrated radiating elements such as antennae or launchers require testing in production. This testing can include testing of the internal die and testing of the antennae/launchers themselves, as well as the properties of the package that can influence the performance of the antennae/launchers (such as the "artificial dielectric" which is required to achieve the required directional characteristic of the antennae/launchers).

Normally this test can only be done by an external loopback path from transmitter antennae/launchers to receiver antennae/launchers. Tight specification parameters for IC transmit power, transmit and receive antennae/launchers gain and receiver noise figure require this loopback path to be extremely precise, despite the very challenging environmental conditions on production test floors.

In advanced radar transceiver ICs, a recently evolving technology is to integrate transmit and receive antennae into the package (Antennae in Package: AiP). Another technology is to integrate launchers into the package—these launchers are connected via wave guides to external antennae of the package. For such ICs, RF transmitter output power and receiver noise figure are key parameters, but measuring them is extremely difficult because the measurement result depends strongly on a number of conditions such as:

the directivity characteristic of the integrated antennae;
impedance and matching of the integrated antennae to the on-chip active device (e.g., Low Noise Amplifier (LNA), Power Amplifier (PA));
the dielectric properties (e.g., δk and tan δ) of the stack-up material used to realize the radiation directivity of the integrated antennae;
x/y and z displacement of the integrated antennae with respect to the reference antenna used for the measurement; and
the contact pressure of the measurement antenna to the IC package.

These dependencies can be mitigated if the RF signals from the IC transmit antennae are fed via an external loopback path to the IC receive antenna, so that the IC can measure the received signal amplitude and phase.

The loopback path can be realized using a waveguide. The parameters of the waveguide such as wall thickness, surface roughness and alignment accuracy to the integrated antennae largely influence the measurements. Therefore, it is desirable to have a standardized loopback device to be used for all cases where RF parameters need to be precisely measured including, for example:

validation at the IC manufacturer,
validation at the OEM manufacturer;
production test at the IC manufacturer,
customer reject analysis at the OEM;
customer reject analysis at the IC manufacturer;
qualification (e.g., life time tests) at the customer site; and
adjustment of new external antennae in the field, i.e. in car workshops.

A solution for a standardized loopback device at the various sites, combining high precision, high sensitivity to antenna or launcher misalignments, but low sensitivity to misalignments of this loopback device, is currently not available.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided an apparatus comprising:

a semiconductor device comprising an integrated circuit and a plurality of external radiating elements at a surface of the device, the radiating elements including at least one transmit element and at least one receive element; and a test apparatus for testing the semiconductor device, the test apparatus comprising:

a surface for placing against said surface of the device; and at least one waveguide, wherein each waveguide extends through the test apparatus for routing electromagnetic radiation transmitted by one of said transmit elements of the device to one of the receive elements of the device, wherein each waveguide comprises a plurality of waveguide openings for coupling electromagnetically to corresponding radiating elements of the plurality of radiating elements located at the surface of the device, wherein a spacing between the waveguide openings of each waveguide of the test apparatus is larger than, or smaller than a spacing between the corresponding radiating elements of the device.

According to another aspect of the present disclosure, there is provided a method of testing a semiconductor device, the method comprising:

providing a semiconductor device comprising an integrated circuit and a plurality of external radiating elements at a surface of the device, the radiating elements including at least one transmit element and at least one receive element:

providing a test apparatus for testing the semiconductor device, the test apparatus comprising:

a surface for placing against said surface of the device; and at least one waveguide, wherein each waveguide extends through the test apparatus for routing electromagnetic radiation transmitted by one of said transmit elements of the device to one of the receive elements of the device, wherein each waveguide comprises a plurality of waveguide openings for coupling electromagnetically to corresponding radiating elements of the plurality of radiating elements located at the surface of the device.

wherein a spacing between the waveguide openings of each waveguide of the test apparatus is larger than, or smaller than a spacing between the corresponding radiating elements of the device, and transmitting electromagnetic radiation from at least one said transmit element to at least one said receive element via at least one waveguide of the test apparatus.

By including a deliberate non-zero spacing mismatch between the waveguide openings of each waveguide of the test apparatus and the corresponding radiating elements of the device, sensitivity to further unintended mismatching between the waveguide openings and the radiating elements (e.g. due to manufacturing variations or other sources) may be reduced.

The radiating elements of the semiconductor device may, for instance, comprise antennae and/or launchers. The transmit elements may accordingly, for instance, comprise transmit antennae or transmit launchers, while the receive elements may accordingly, for instance, comprise receive antennae or receive launchers.

A spacing between the waveguide openings of each waveguide of the test apparatus may be larger than, or smaller than, a spacing between the corresponding radiating elements of the device by at least 0.1%. A spacing between the waveguide openings of each waveguide of the test apparatus may be larger than, or smaller than, a spacing between the corresponding radiating elements of the device by at least 1%.

In some embodiments, the spacing between the waveguide openings of each waveguide of the test apparatus may be smaller than the spacing between the corresponding radiating elements of the device. In other embodiments, the spacing between the waveguide openings of each waveguide of the test apparatus may be larger than the spacing between the corresponding radiating elements of the device.

At least one of the waveguides may be configured to route electromagnetic radiation transmitted by one of said transmit elements of the device to a plurality of receive elements of the device. This can allow the plurality of receive elements collectively to be used for testing the transmit element (and vice versa), bearing in mind that the transmit power of the transmit element may exceed the power receivable by a single receive element.

The apparatus waveguide may have:
a first branch for conveying electromagnetic radiation transmitted by said transmit element; and
at least two further branches coupled to the first branch for route said electromagnetic radiation to said plurality of receive elements.

The semiconductor device may include a semiconductor die located in a package. The surface of the device at which the plurality of external radiating elements are located may be an external surface of the package.

The semiconductor device may include:
a semiconductor die located in a package; and
a carrier, wherein the package is mounted on a carrier, wherein the surface of the device at which the plurality of external radiating elements are located is a surface of the carrier.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1A:
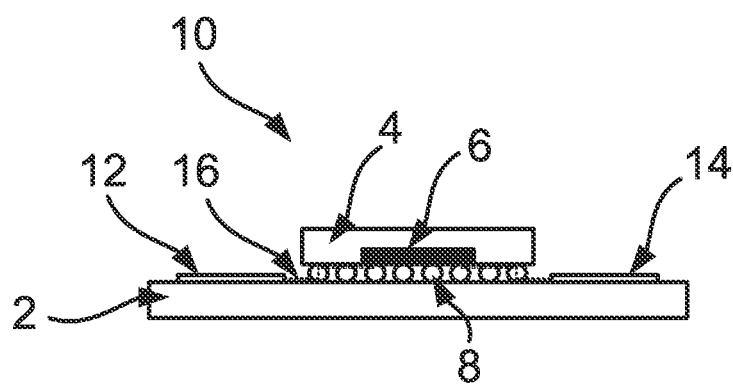
FIG. 1A shows a semiconductor device using strip line antennae.
Figure 1B:
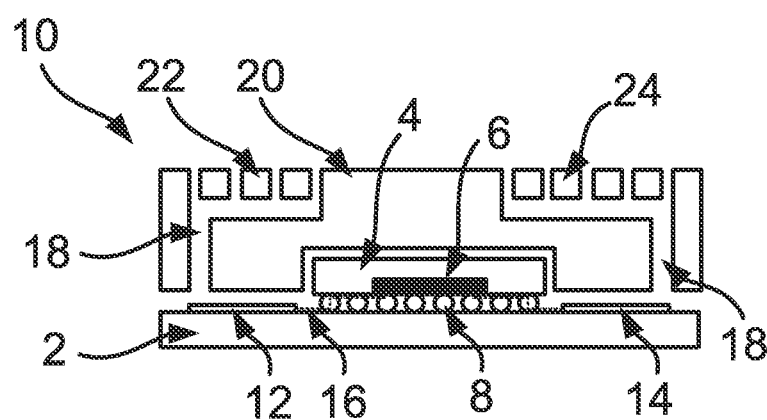
FIG. 1B shows a semiconductor device using an external launcher.

FIGS. 1A, 1B and IC each show an example of a semiconductor device 10.

The device 10 in FIG. 1A includes a semiconductor die 6 forms an integrated circuit, which may typically include circuitry for transmitting/receiving and processing mm-wave signals for use in, for example, the automotive industry. The semiconductor die 6 may be encapsulated in an encapsulant 4. In this example, the semiconductor die 6 is mounted on a surface of a carrier 2, such as a primed circuit board. The carrier 2 may comprise, for example, RO3003 or RF4 materials. Electrical connections 8 between the carrier and the semiconductor die 6 may be formed using, for example, an array of solder balls as shown in FIG. 1, although other kinds of connections of the kind known in the art may be used also.

Figure 1C:
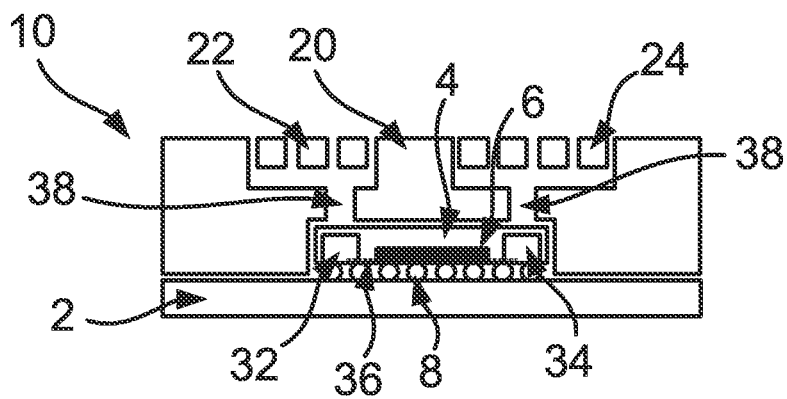
FIG. 1C shows a semiconductor device using an integrated launcher.

The semiconductor device 10 in each of FIGS. 1A, 1B and 1C includes a plurality of radiating elements located at a surface of the device 10. In the example of FIG. 1, the radiating elements are provided in the form of strip line antennae 12, 14 comprising metallic strips located on the surface of the carrier 2. The radiating elements include a plurality of transmit elements 12 and a plurality of receive elements 14. Electrical connections 16 between the radiating elements and the semiconductor die 6 may be formed by a combination of metal tracks located on the surface of the carrier 2 and the aforementioned electrical connections 8.

The semiconductor device 10 shown in FIG. 1B is similar to that shown in FIG. 1A, except that the device 10 further includes a waveguide antenna 20 which may be located on top of the semiconductor die 6 and the carrier 2. The waveguide antenna 20 includes channels 18 for guiding electromagnetic radiation to/from the plurality of receive elements 14 and the plurality of transmit elements 12. These channels may terminate in an array of transmit elements 22 and an array of receive elements 24. In the example of FIG. 1B, it is the transmit elements 22 and the receive elements 24 that form the radiating elements of the semiconductor device 10. The arrangement of the strip line antennae and radiating elements in the example of FIG. 1B may be referred to as an external launcher.

The semiconductor device 10 shown in FIG. 1C is similar to that shown in FIG. 1C, except that the device 10 in FIG. 1C does not include strip line antennae as described above in relation to FIGS. 1A and 1B. Instead, the device 10 in FIG. 1C includes transmit elements 32 for transmitting mm-wave signals and receive elements 34 for transmitting mm-wave signals which are provided inside the encapsulant 4. Electrical connections 36 between the semiconductor die 6 and the transmit elements 32 and receive elements 34 may pass through the encapsulant (and/or via the electrical connections 8). Like the semiconductor device 10 of FIG. 11, the semiconductor device 10 in FIG. 1C includes a waveguide antenna 20, which may be located on top of the semiconductor die 6 and the carrier 2. The waveguide antenna 20 includes channels 38 for guiding electromagnetic radiation to/from the receive elements 34 and the transmit elements 32. Again, these channels may terminate in an array of transmit elements 22 and an array of receive elements 24. In the example of FIG. 1C, it is again the transmit elements 22 and the receive elements 24 that form the radiating elements of the semiconductor device 10. The arrangement of the transmit elements 32 and receive 34 and radiating elements 22, 24 in the example of FIG. 1C may be referred to as an integrated launcher.

In FIG. 1A, the encapsulant 4 may be considered to form a package of the semiconductor die 6. In FIGS. 1B and 1C, the encapsulant 4 and/or the waveguide antenna 20 may be considered to form a package of the semiconductor die 6.

As noted previously, to test a semiconductor device 10 of the kind shown in FIGS. 1A-1C, it is necessary to test the operation of the radiating elements. The test may involve placing a plunger against the surface of the semiconductor device 10, the plunger having waveguide openings for coupling electromagnetically to the radiating elements of the device 10. The plunger may include a loopback path, allowing the receive elements of the device 10 to receive electromagnetic radiation (mm-wave signals) transmitted by the transmit elements of the device 10. A solution for a standardized loopback path device at the various sites, combining high precision, high sensitivity to radiating element misalignments, but low sensitivity to misalignments of this loopback path device, is currently not available.

Test apparatuses according to embodiments of this disclosure will now be described in relation to FIGS. 2 to 12.

Figure 2A:
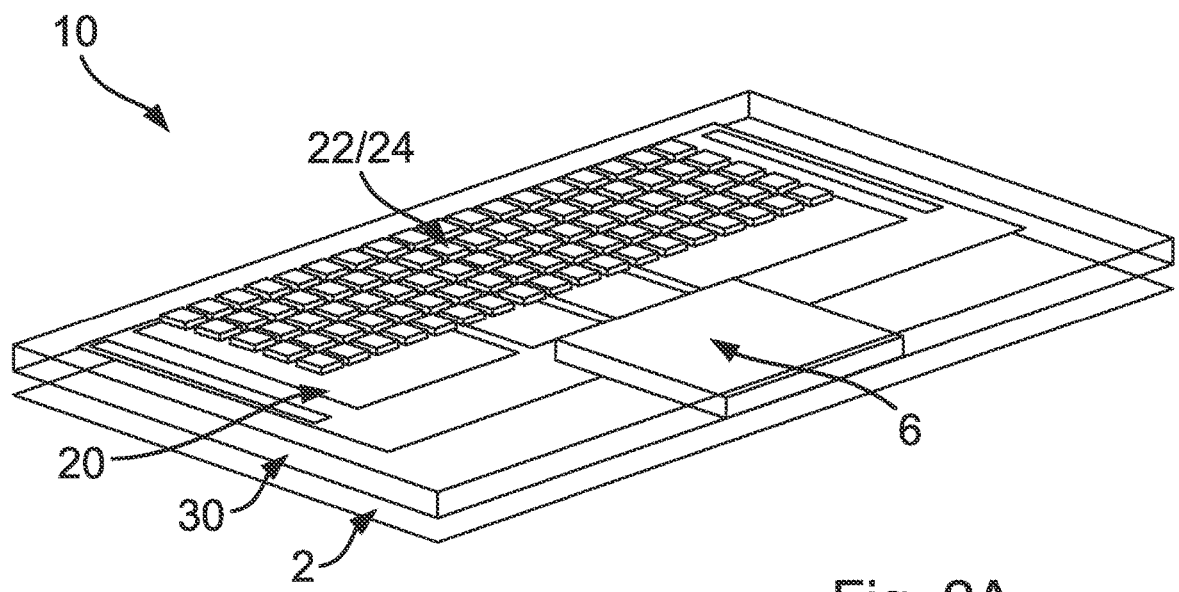
FIGS. 2A, 2B and 2C illustrate a semiconductor device, dielectric layer and plunger according to an embodiment of this disclosure.

FIG. 2A shows a semiconductor device 10 which shares features of the kind described above in relation to FIG. 1. The device 10 includes a semiconductor die 6 which may be provided in an encapsulant 30. The device 10 also includes a waveguide antenna 20, which includes a plurality of radiating elements arranged in an array, which includes transmit elements 22 and receive elements 24 provided at a surface of the device 10. The semiconductor die 6, encapsulant 30 and waveguide antenna 20 may be mounted on a surface of a carrier 20, as explained in relation to FIG. 1.

Figure 2B:
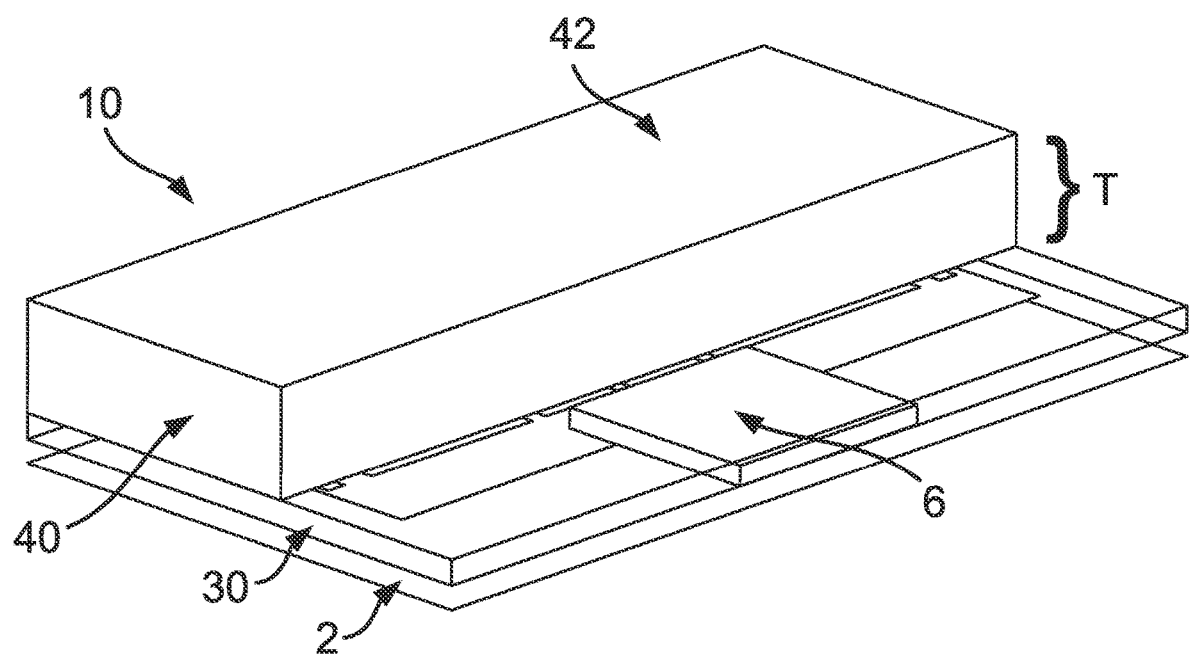

The test apparatus in this embodiment includes a dielectric portion 40, which may be included in a plunger. The dielectric portion 40 is shown in FIG. 2B with the remainder of the plunger omitted (further details of the plunger will be described below with reference to FIG. 2C. The dielectric portion 40 may be provided in the form of a layer. The dielectric portion 40 has a surface (the underside of the dielectric portion 40 shown in FIG. 2B), which may be placed against the surface of the semiconductor device 10 that includes the radiating elements of the device 10. The surface to be placed against the surface of the semiconductor device 10 that includes the radiating elements of the device 10 may, for example, be substantially planar, although it also may in general be profiled to match the profile of the surface of the semiconductor device 10. The dielectric portion 40 may also have a surface 42 (which is generally an opposite surface of the dielectric portion 40 to the surface which is to be placed against the semiconductor device 10). Further features of the plunger (such as the plurality of waveguide openings of the plunger, to be described below) may be located against the surface 42 of the dielectric portion 40.

Figure 2C:
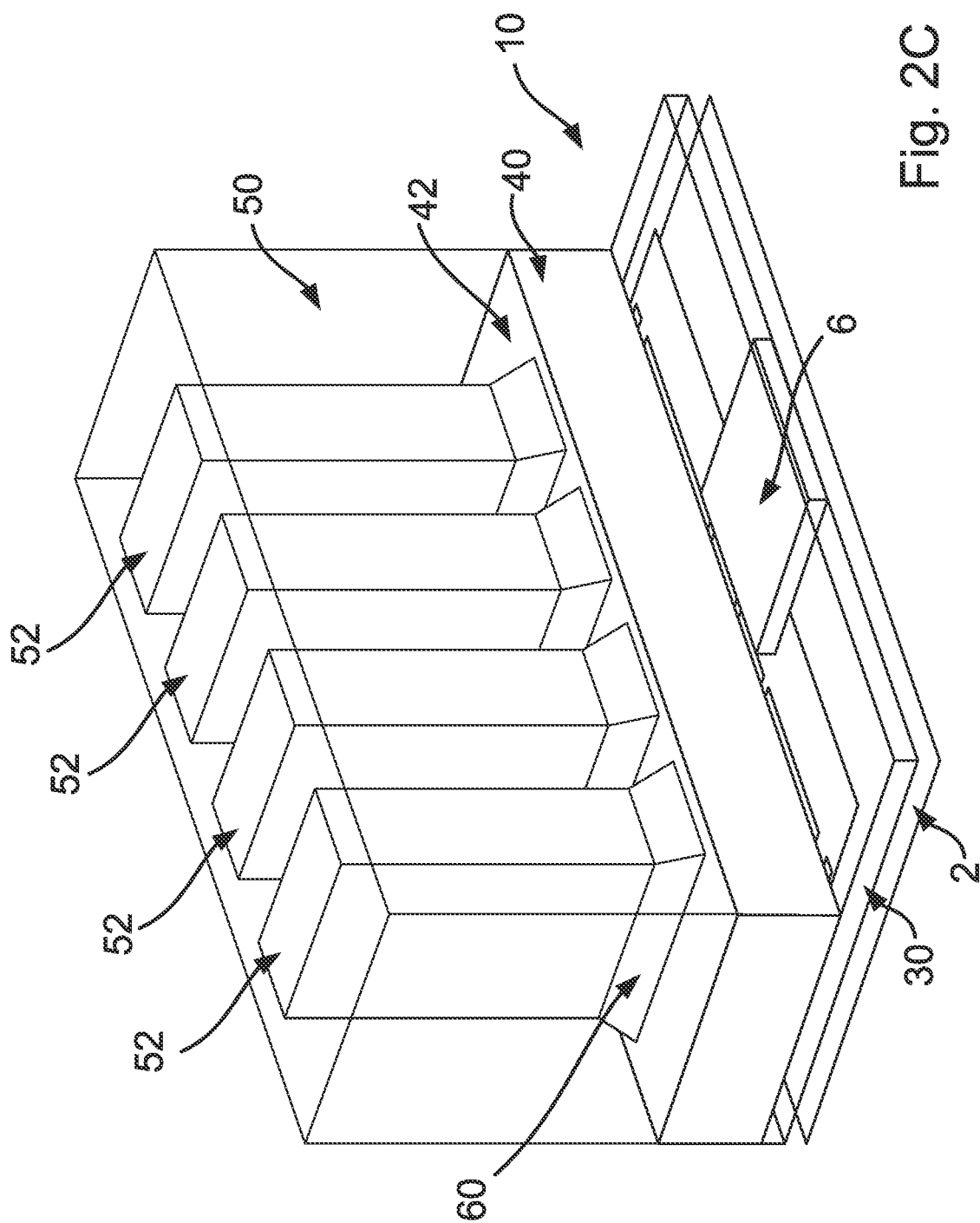

Turning to FIG. 2C, the plunger may further include a block 50, which can house a plurality of waveguide openings 60 and waveguides 52. The block may comprise a metal (e.g. copper). The waveguide openings 60 are arranged in locations that correspond to the locations of the transmit elements 22 and receive elements 24 provided at the surface of the device 10, thereby allowing the plurality of waveguide openings 60 to couple electromagnetically to corresponding transmit/receive elements of the plurality of radiating elements located at the surface of the device.

The waveguides 52 may comprise channels that extend into the plunger from the waveguide openings 60, so as to route electromagnetic radiation transmitted by the transmit elements 22 to the receive elements 24 in a loopback arrangement as explained previously. The waveguides may be filled with a dielectric. Each waveguide may extend between at least one of the transmit elements 22 and at least one of the receive elements 24. As shown in FIG. 2C, the waveguide openings 60 may taper outwardly as the extend away from the waveguides 52, so as to provide a better matching to the electromagnetic field in the dielectric portion 40.

The dielectric portion 40 is configured to provide a matched interface for the electromagnetic coupling of the plurality of waveguide openings 60 of the plunger to the plurality of radiating elements (the transmit elements 22 and the receive elements 24) of the semiconductor device 10. To this end, the material of the dielectric portion 40 may be chosen according to the specific application and the electromagnetic wavelengths to be used in the testing of the device 10. Suitable materials for the dielectric portion 40 include high-density polyethylene (HDPE) and a polycarbonate such as Makrolon or Peek, or a ceramic material. The thickness T (see FIG. 2B) of the dielectric portion 40 may also be chosen so as to enhance the matched interface between the plurality of waveguide openings 60 of the plunger and the plurality of radiating elements (the transmit elements 22 and the receive elements 24) of the semiconductor device 10. In particular, the thickness T of the dielectric portion 40 may be chosen to be $\lambda/2$, where $\lambda$ is a wavelength of the electromagnetic radiation to be used (i.e. transmitted by the transmit elements 22 and received by the receive elements 24) during the testing of the semiconductor device 10. Note that $\lambda$ denotes the wavelength of the electromagnetic radiation inside the dielectric portion 40. By way of example only, where the dielectric portion 40 comprises HDPE, and considering an example frequency of 77 GHz, the thickness T may be chosen to be around 2.7 mm. In another example, where the dielectric portion 40 comprises Makrolon, and again considering an example frequency of 77 GHz, the thickness T may be chosen to be around 2 mm.

The dielectric portion 40 may also act to provide a seal to prevent unwanted airflow during testing of the semiconductor device 10 using the test apparatus. For instance, by placing the dielectric portion 40 against the surface of the semiconductor device 10 including the radiating elements of the device 10, the dielectric portion 40 may seal off the surface of the semiconductor device 10 including the radiating elements. This can prevent airflow around the radiating elements of the device 10, which may otherwise affect the results of the test. It is also noted that the dielectric portion 40 may seal off the waveguide openings 60 of the plunger, again to prevent unwanted airflow.

Although the embodiment of FIG. 2 is described in relation to a semiconductor device which, as described in FIGS. 1B and 1C, has a waveguide antenna 20, it is envisaged that the plunger may also be used with a semiconductor device 10 of the kind shown in FIG. 1A. In such cases, the waveguide openings 60 of the plunger may couple directly with the strip line antennae 12, 14 on the surface of the carrier 2, which form the radiating elements of the device 10 in such embodiments.

Figure 3:
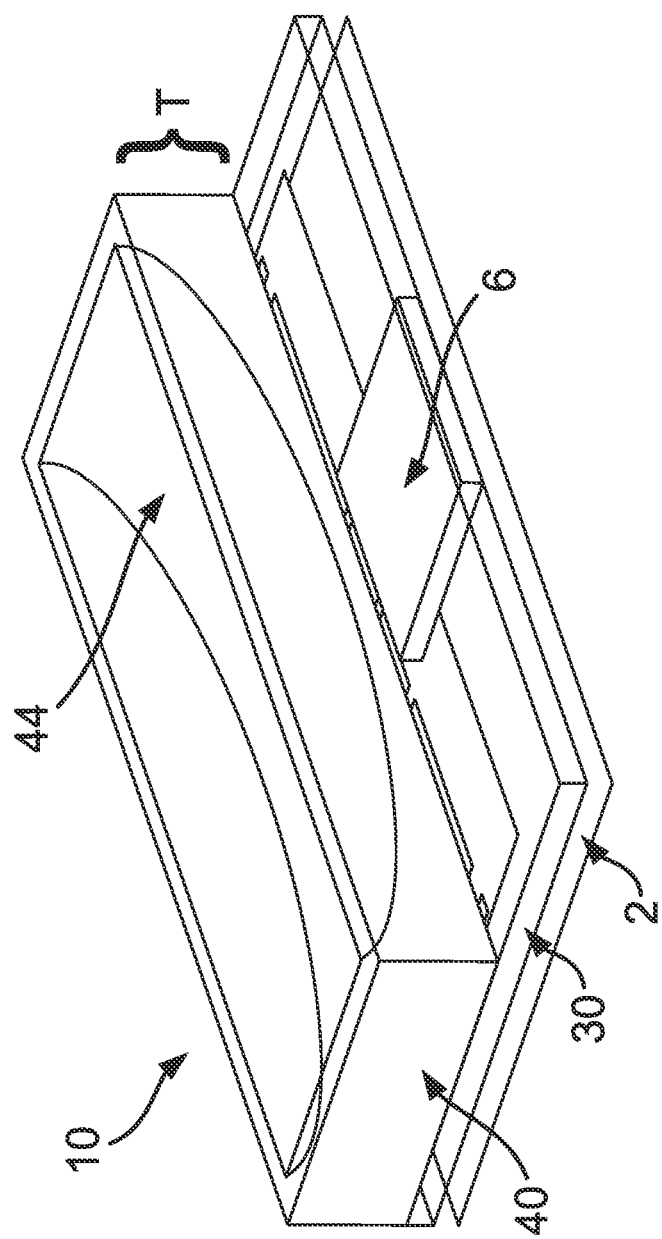
FIG. 3 shows a semiconductor device and dielectric layer according to an embodiment of this disclosure.

In some embodiments, the dielectric portion may include a curved surface, for coupling electromagnetic radiation transmitted by a plurality of transmit elements 22 of the device 10 to a waveguide opening 60 of said plurality of waveguide openings of the plunger. Conversely, the curved surface may also allow coupling of electromagnetic radiation transmitted by one of the waveguide openings 60 to a plurality of receive elements 24 of the device. An example of such an embodiment is shown in FIG. 3. As with FIG. 2B, the dielectric portion 40 in FIG. 3 is shown with the remainder of the plunger omitted so as to reveal the configuration of the curved surface 44. The curved surface may act as a lens antenna. The curved surface 44 in this embodiment is concave when viewed from the waveguide(s) of the plunger. In other embodiments, curved surface 44 may be convex when viewed from the waveguide(s) of the plunger. The curved surface 44 may, for instance, have a substantially cylindrical profile as shown in FIG. 3, however other surface profiles are envisaged. The curvature of the curved surface 44 may be chosen according to the dielectric constant of the material used to form the dielectric portion 40. The space created between the curved surface 44 and the waveguide openings 60 of the plunger may be filled with another dielectric, such as air.

In some embodiments, at least one of the waveguides of the plunger may be configured to route electromagnetic radiation transmitted by one of the transmit elements 22 of the device 10 to a plurality of receive elements 24 of the device 10. Examples of this will be described below in relation to the embodiments of FIGS. 4 and 5.

Figure 4:
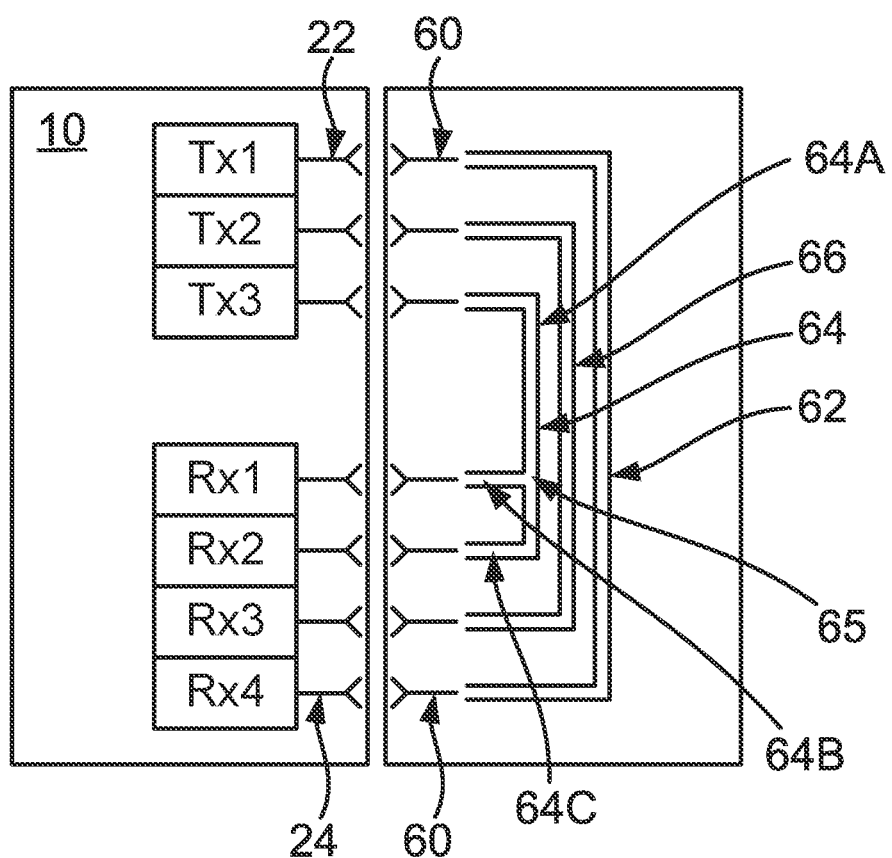
FIG. 4 show a semiconductor device and plunger according to an embodiment of this disclosure.

FIG. 4 schematically illustrates the coupling of a plurality of waveguide openings 60 of a plunger according to an embodiment of this disclosure to a plurality of transmit elements 22 (Tx1, Tx2, Tx3) and a plurality of receive elements 24 (Rx1, Rx2, Rx3, Rx4) of a semiconductor device 10. In this embodiment, waveguide 62 of the plunger routes electromagnetic radiation from transmit element Tx1 to receive element Rx4, while waveguide 66 routes electromagnetic radiation from transmit element Tx2 to receive element Rx3. Accordingly, waveguides 62, 66 each route electromagnetic radiation between a single transmit element 22 and a single receive element 24. However, as can be seen in FIG. 4, waveguide 64 in this embodiment routes electromagnetic radiation from transmit element Tx3 to receive element Rx1 and also to receive element Rx2. This kind of arrangement can allow a plurality of receive elements 24 collectively to be used for testing the transmit element 22 (and vice versa) of the device 10, bearing in mind that the transmit power of the transmit element 22 may exceed the power receivable by a single receive element 24.

In order to implement the routing of electromagnetic radiation from a transmit element 22 of the device 10 to more than one receive element 24 of the device 10, the waveguide used (e.g. see waveguide 64 in FIG. 4) may include a plurality of branches. In FIG. 4 for instance, the waveguide 64 in FIG. 4 includes a first branch 64A for conveying electromagnetic radiation transmitted by transmit element Tx1, a second branch 64B for routing the electromagnetic radiation to receive element Rx1 and a third branch 64C for routing the electromagnetic radiation to receive element Rx2. The first branch 64A of waveguide 64 in this embodiment thus splits into two separate branches 64B, 64C at location 65.

Figure 5A:
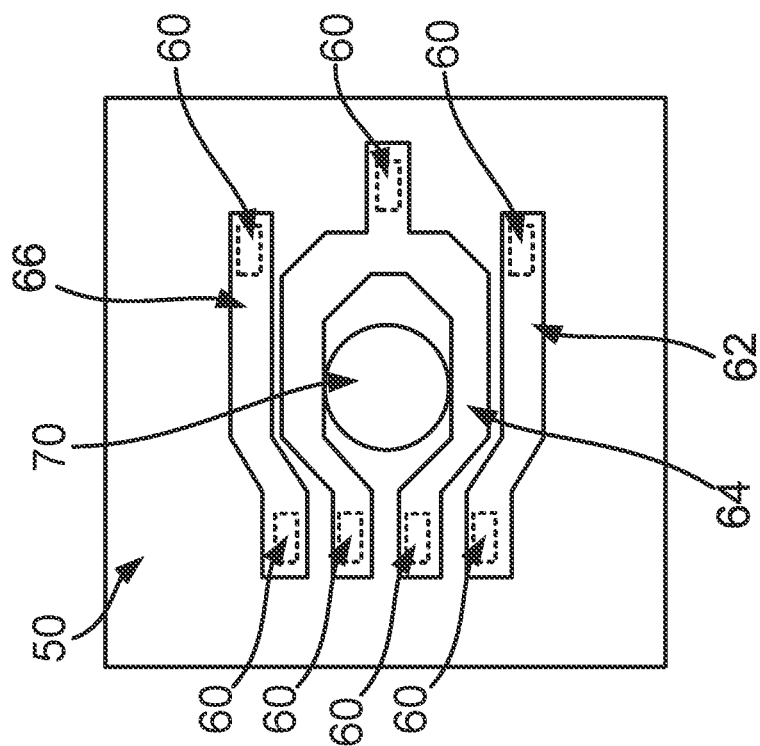
FIGS. 5A and 5B show a semiconductor device, dielectric layer and plunger according to an embodiment of this disclosure.
Figure 5B:
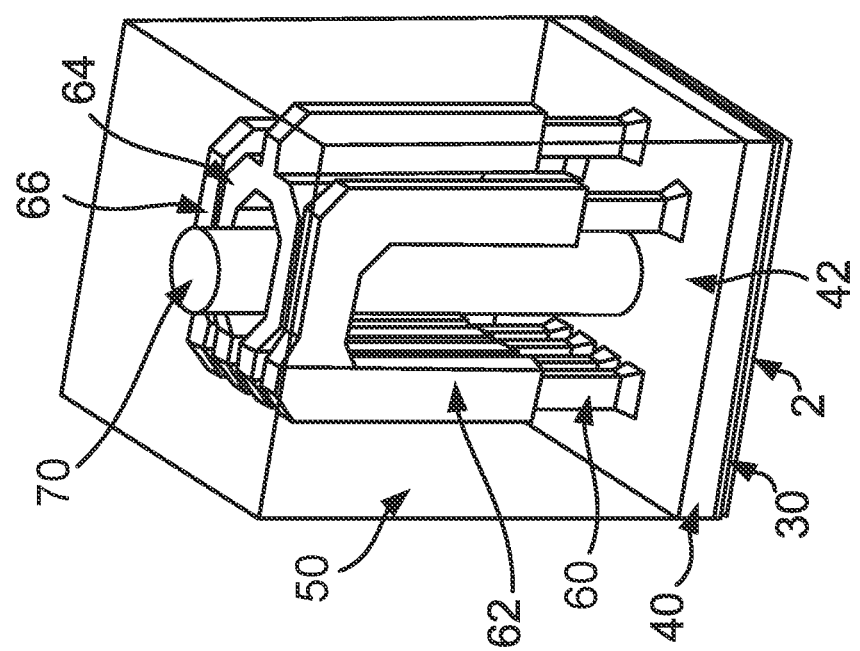

FIGS. 5A and 5B show an example construction of a plunger having at least one branched waveguide of the kind described above in relation to FIG. 4. FIG. 5A is a 3D view, while FIG. 5B is a plan view, viewed from above the surface to the semiconductor device 10 having the radiating elements. The semiconductor device 10 itself is also shown in FIG. 5A.

The arrangement of the waveguides 62, 64, 66 in FIGS. 5A and 5B is similar to that shown in FIG. 4, with the waveguides 62, 66 each routing electromagnetic radiation between a single transmit element 22 and a single receive element 24 and the waveguide 64 including multiple branches for routing of electromagnetic radiation from a transmit element 22 of the device 10 to more than one receive element 24 of the device 10. FIGS. 5A and 5B also include a cut out 70 in the block 50, which may be receiving a nozzle of the plunger, for use in moving the plunger into position during the test procedure. As can be seen in FIGS. 5A and 5B, the waveguides 62, 64, 66 can be shaped around the cut out 70—for instance the branches of the waveguide 64 split on one side of the cut out, and the branches leading to the receive elements 24 of the device 10 may extend through the plunger on opposite sides of the cut out 70.

Figure 6A:
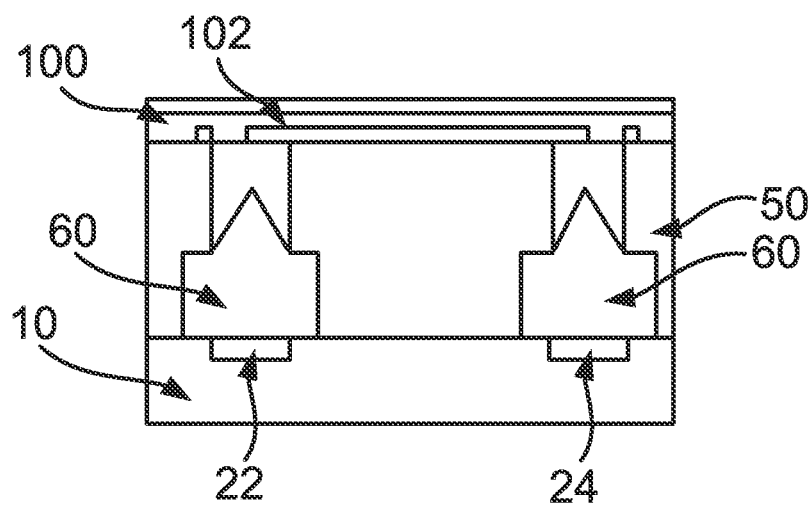
FIGS. 6A and 6B show a semiconductor device, dielectric layer and plunger according to an embodiment of this disclosure.
Figure 6B:
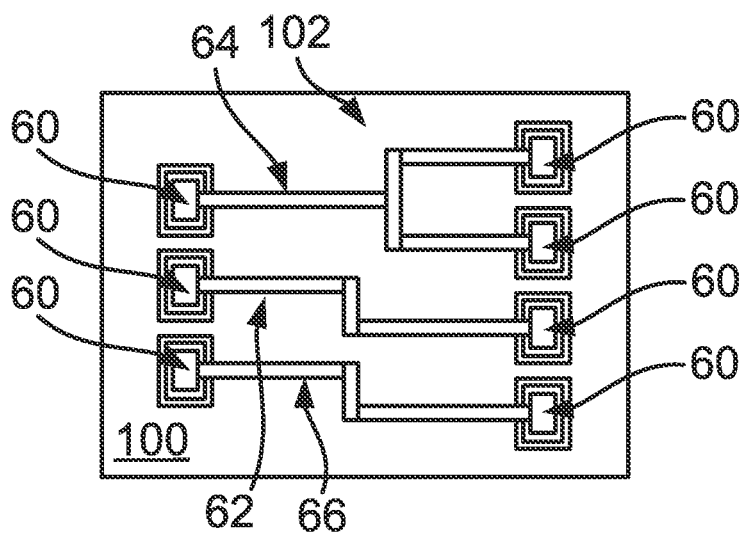

FIGS. 6A and 6B show an example construction of a plunger having at least one branched waveguide of the kind described above in relation to FIG. 4. FIG. 6A is a cross section, while FIG. 6B is a plan view, viewed from above the surface to the semiconductor device 10 having the radiating elements. The semiconductor device 10 itself is also shown in FIG. 6A.

The arrangement of the waveguides 62, 64, 66 in FIGS. 6A and 6B is again similar to that shown in FIG. 4, with the waveguides 62, 66 each routing electromagnetic radiation between a single transmit element 22 and a single receive element 24 and the waveguide 64 including multiple branches for routing of electromagnetic radiation from a transmit element 22 of the device 10 to more than one receive element 24 of the device 10.

In this embodiment, the routing of the waveguides is implemented using a printed circuit board (PCB) 100 located on the plunger. The PCB 100 includes patterned metal features 102 that are shaped and configured so as to route the electromagnetic radiation in the waveguides. It is envisaged that a PCB 100 of the kind described here in relation to FIGS. 6A and 6B may also be used to implement routing in a plunger that does not include branched waveguides such as waveguide 64, but in which each waveguide routes the electromagnetic radiation from a single transmit element 22 to a single receive elements 24 of the device 10.

Figure 7:
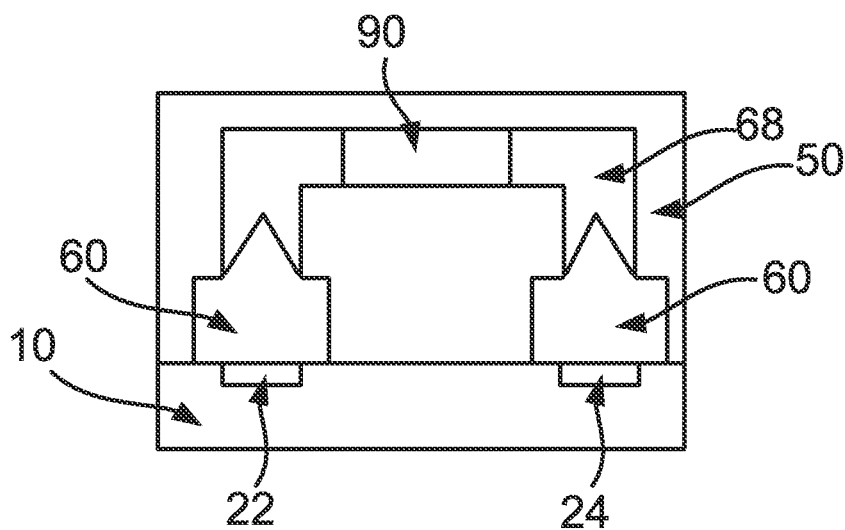
FIG. 7 shows a semiconductor device and plunger according to an embodiment of this disclosure.

In some embodiments one or more of the waveguides may be provided with an attenuating portion for attenuating the electromagnetic radiation transmitted by the transmit element/elements 22 of the semiconductor device 10 before it is looped back around to the receive element/elements 24 of the device 10. An example of this is shown in the embodiment of FIG. 7. As shown in FIG. 7, the attenuating portion 90 may be located inside waveguide 68. Suitable materials for the attenuating portion include an absorbing foam such a those available from ECOSORB. The attenuating portion 90 can allow a receive element 24 of the semiconductor device 10 to receive electromagnetic radiation from one (or more) transmit elements 22 of the semiconductor device 10, bearing in mind that the transmit power of the transmit element/elements 22 may exceed the power receivable by a single receive element 24.

In a standard way of measuring the RF parameters of a mmWave device, the RF parameters of a mmWave integrated circuit are directly measured during validation, production testing, at the customer validation site, and in repair workshops in the field. This generally requires mmWave test lab equipment, standardized measurement antennae and several measurement parameters to be standardized. Despite the high effort and costs for such measurements, the result is often too imprecise and not sufficiently repeatable and reproducible. Accordingly, this procedure does not fit for precise mmWave radar measurements in varying environments, with varying measurement equipment and several other parameters, which are hard to standardize.

As explained previously, testing of a mmWave device can be performed by forming a loopback path, in which the electromagnetic radiation transmitted by transmit elements of a device may be looped back to the receive elements of the device. Testing of this kind may involve the following steps.

First, the RF parameters on several integrated circuits may be directly measured in a nmWave RF lab. Then, the RF parameters of these integrated circuits may be determined using an external device containing a loopback path. The RF lab can correlate the RF parameters, measured by the lab equipment, with the RF loopback parameters as measured by the loopback method. The RF loopback parameters, measured under standardized conditions, can then then serve as a reference.

Accordingly, following this approach, what is guaranteed to the customers are the parameters measured by loopback test using a standardized loopback device, not those parameter measured in a mmWave RF lab. In other words, what is guaranteed to the customers is the receive power, and the receive noise level, measured by the integrated circuit when the loopback device is used. What is not guaranteed is transmitter output power or the receiver noise figure.

The loopback device may then be used in all occurrences the RF parameters are needed, for instance in validation, production testing, testing of customer rejects, testing at the customer site and in car repair workshops.

Figure 8:
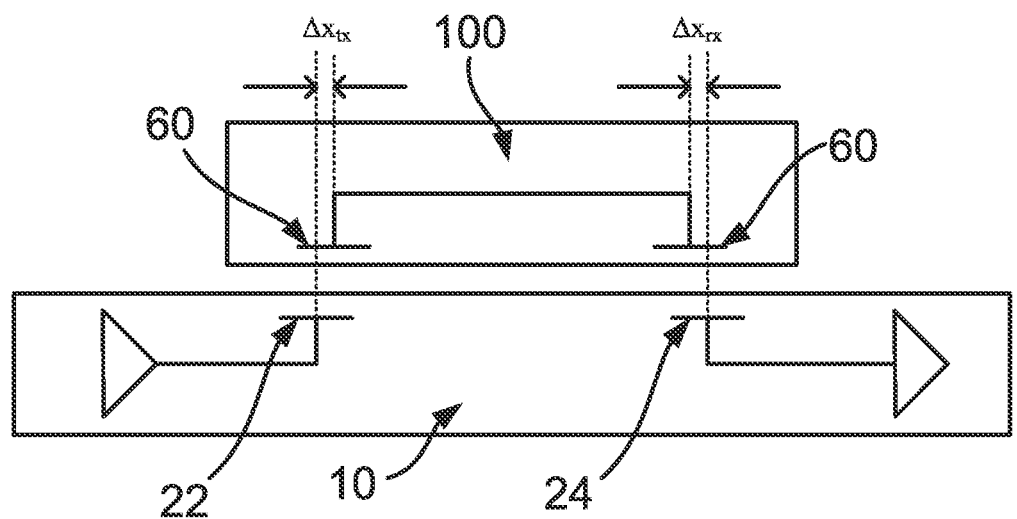
FIG. 8 shows a semiconductor device and test apparatus according to an embodiment of this disclosure.

FIG. 8 schematically illustrates the test setup for testing a semiconductor device of the kind described here, using the loopback approach. The setup includes the test apparatus 100, which may include waveguides having waveguide openings 60 for looping the electromagnetic radiation transmitted by the transmit elements 22 of the device 10 under test to the receive elements 24 of the device 10. For simplicity, the device 10 illustrated in FIG. 8 includes a single transmit element 22 and a single receive element, while the test apparatus includes two respective waveguide openings 60 and a single, non-branched, waveguide. Nevertheless, it will be appreciated that the principles to be described below apply also to devices 10 including more than one transmit element 22 and/or receive element 24 and to test apparatuses including corresponding waveguide openings 60, as well as to test apparatuses including branched waveguides as explained in relation to FIGS. 4 and 5.

A potential issue with a test setup of the kind shown in FIG. 8 is that misalignment of the waveguide openings 60 of the test apparatus 100 with the radiating elements 22, 24 of the device 10 under test can lead to inaccurate test results. In FIG. 8, a lateral misalignment between the transmit element 22 of the device 10 and the corresponding waveguide opening 60 of the test apparatus 100 is denoted as $\Delta x_{tx}$, while a misalignment between the receive element 22 of the device 10 and the corresponding waveguide opening 60 of the test apparatus 100 is denoted as $\Delta x_{rx}$.

Figure 9:
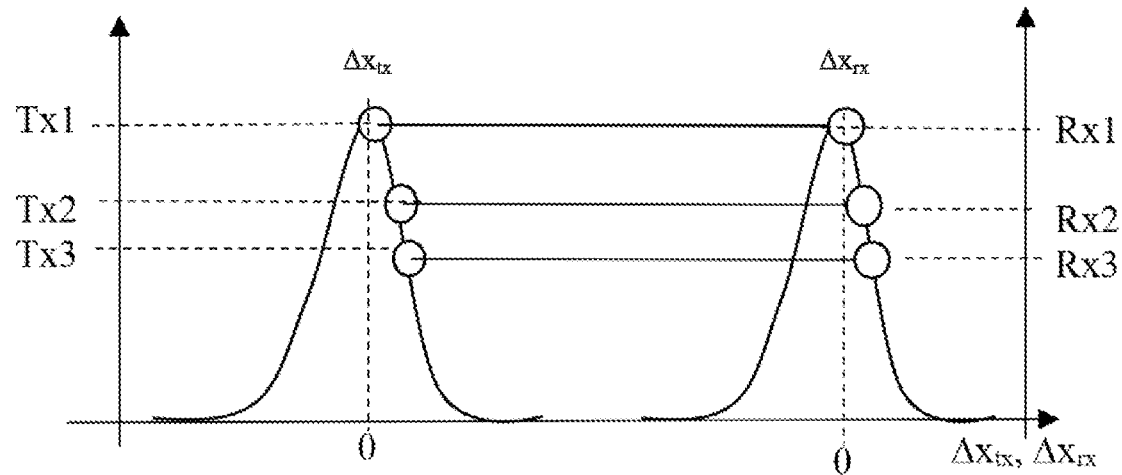
FIG. 9 shows the effect of mismatches between the lateral positions of the radiating elements of a semiconductor device and the waveguide openings in a test apparatus.

FIG. 9 illustrates the effects of the misalignments noted above. The vertical axis in FIG. 9 denotes the coupling factor (in dB) between the transmit element 22 of the device 10 and the corresponding waveguide opening 60 of the test apparatus 100 (left hand curve) and the coupling factor between the receive element 24 of the device 10 and the corresponding waveguide opening 60 of the test apparatus 100 (right hand curve). The coupling factor is shown as a function of misalignment $\Delta x_{tx}$ (left hand curve) and misalignment $\Delta x_{rx}$ (right hand curve). Note that for each radiating element 22, 24, it is assumed the peak coupling factor occurs when $\Delta x_{tx}$ and $\Delta x_{rx}$ are zero, i.e. when each radiating element 22, 24 and its corresponding waveguide opening 60 are positioned directly opposite each other, without any lateral misalignment (represented by Tx1 and Rx1 in FIG. 9). As can be seen from the curves in FIG. 9, the coupling factor decreases with increasing positive or negative misalignment $\Delta x_{tx}$, $\Delta x_{rx}$.

It will be appreciated that, assuming the fixed lateral spacing between the transmit element 22 and the receive element 24 is equal to the fixed lateral distance between the corresponding waveguide opening 60 of the test apparatus 100, a lateral misalignment between transmit element 22 and its corresponding waveguide opening 60 of the test apparatus 100 results in a corresponding lateral misalignment between receive element 24 and it corresponding waveguide opening 60 of the test apparatus 100. That is to say, in FIG. 9, in general $\Delta x_{tx} = \Delta x_{rx}$.

Tx2 and Rx2 in FIG. 9 correspond to a small misalignment, while Tx3 and Rx3 correspond to a larger misalignment. The coupling factor for each radiating element/waveguide opening pair at Tx2, Rx2 is reduced compared to Tx1, Rx1 ($\Delta x_{tx} = \Delta x_{rx} = 0$) owing to the small misalignment of the radiating elements/waveguide openings, while the coupling factor for each radiating element/waveguide opening pair at Tx3, Rx3 is further reduced compared to Tx2, Rx2 owing to the larger misalignment of the radiating elements/waveguide openings.

In accordance with embodiments of this disclosure, the lateral spacing between the waveguide openings 60 of the test apparatus 100 is intentionally made larger than, or smaller than the lateral spacing between the corresponding transmit elements 22 and receive elements 24 of the device 10. As will now be explained in relation to FIG. 10, this automatically (and counterintuitively) leads to misalignments between the transmit and receive elements 22, 24 of the device 10 under test and the corresponding waveguide openings 60 of the test apparatus 100.

Figure 10:
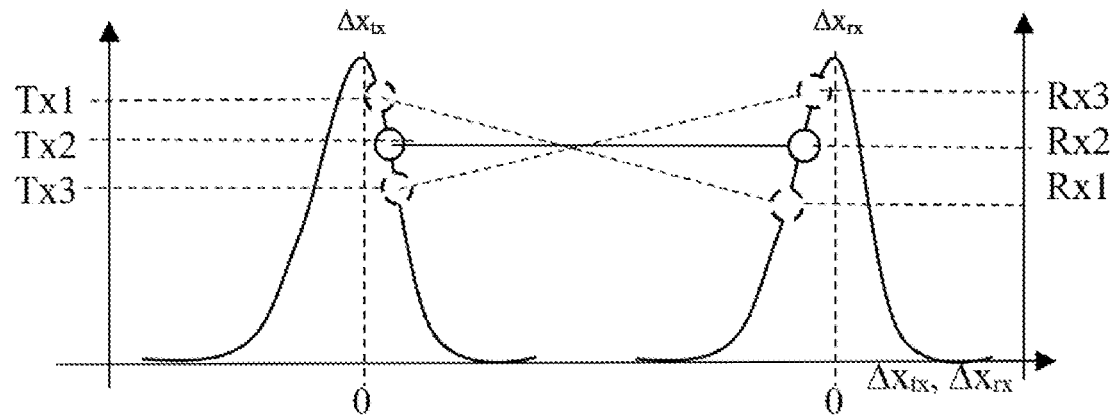
FIGS. 10 to 12 each show the effect of mismatches between the lateral positions of the radiating elements of a semiconductor device and the waveguide openings in a test apparatus according to an embodiment of this disclosure.

Like FIG. 9, FIG. 10 shows the coupling factor between the transmit element 22 of a device 10 under test and its corresponding waveguide opening 60 of the test apparatus 100 (left hand curve), and the coupling factor between the receive element 24 of a device 10 under test and its corresponding waveguide opening 60 of the test apparatus 100 (right hand curve). In this embodiment, the lateral spacing between the waveguide openings 60 of the test apparatus 100 is intentionally smaller than the lateral spacing between the transmit and receive elements 22, 24. When the test apparatus 100 is moved into its measurement position, there will therefore always be at least some misalignment between either the transmit element 22 and its corresponding waveguide opening 60 and/or the receive element 24 and its corresponding waveguide opening 60.

In FIG. 10, three example positions of the test apparatus 100 are illustrated: Tx1, Rx1; Tx2, Rx2; and Tx3, Rx3.

Note that position Tx2, Rx2 gives rise to an equal amount of misalignment (although in the opposite direction) between the transmit element 22 and its corresponding waveguide opening 60 of the test apparatus 100 and between the receive element 24 and its corresponding waveguide opening 60. That is to say that for position Tx2, Rx2, $(\Delta x_{tx} = -\Delta x_{rx})$.

At position Tx1, Rx1, the misalignment between the transmit element 22 and its corresponding waveguide opening 60 is reduced relative to position Tx2, Rx2, whereas the misalignment between the receive element 24 and its corresponding waveguide opening 60 is increased. Similarly, at position Tx3, Rx3, the misalignment between the transmit element 22 and its corresponding waveguide opening 60 is increased relative to position Tx2, Rx2, whereas the misalignment between the receive element 24 and its corresponding waveguide opening 60 is reduced. Accordingly, it will be appreciated that there is a tendency for reductions in the overall coupling factor resulting from misalignments relative to position Tx2, Rx2 to cancel out (bearing in mind that the loopback test arrangement requires the electromagnetic radiation passing through the waveguide of the test apparatus 100 to be coupled twice between the device 10 and the test apparatus 100: once at the transmit element 22 and once at the receive element 24). Because of this, the aforementioned intentional reduction in the lateral spacing between the waveguide openings 60 of the test apparatus 100 has led to an overall reduction in sensitivity of coupling factor to misalignments (relative to position Tx2, Rx2) between the waveguide openings 60 of the test apparatus 100 and those of the device 10 under test. To a first order approximation, the overall coupling factors Tx1+Rx1≈Tx2-Rx2≈Tx3+Rx3. This can improve the accuracy and repeatability of tests on semiconductor devices 10 of the kind described herein, using a test apparatus 100 having a loop back waveguide arrangement.

Figure 11:
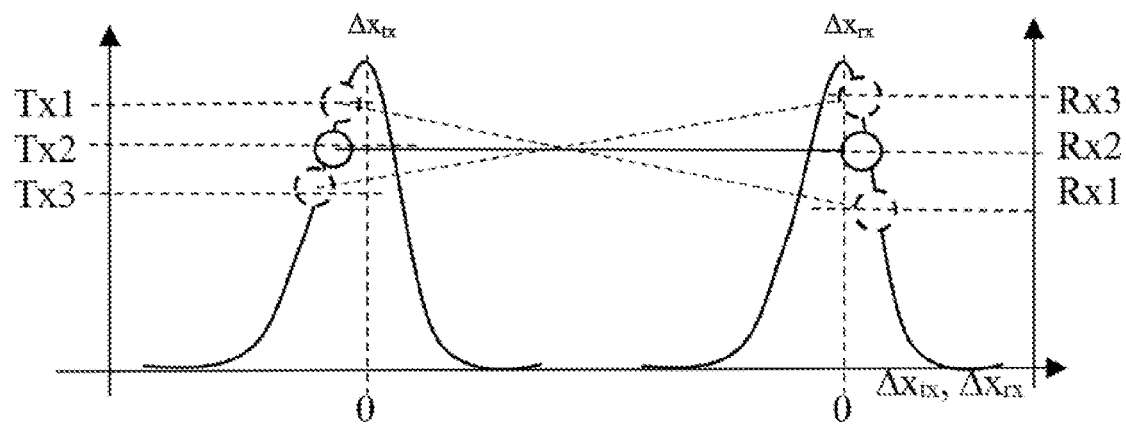

It will be appreciated, for example with reference to FIG. 11, that although in the embodiment of FIG. 10 the lateral spacing between the waveguide openings 60 is smaller than the lateral spacing between the transmit and receive elements 22, 24, similar benefits can arise in cases in which the lateral spacing between the waveguide opening 60 is larger than the lateral spacing between the transmit and receive elements 22, 24. In FIG. 11, three example positions of the test apparatus 100 are again illustrated, although this time for a test apparatus 100 in which the lateral spacing between the waveguide openings 60 is larger than the lateral spacing between the transmit and receive elements 22, 24: Tx1, Rx1; Tx2, Rx2; and Tx3, Rx3.

Again position Tx2, Rx2 gives rise to an equal amount of misalignment (although in the opposite direction) between the transmit element 22 and its corresponding waveguide opening 60 of the test apparatus 100 and between the receive element 24 and its corresponding waveguide opening 60. That is to say that for position Tx2, Rx2, $(-\Delta x_{tx} = \Delta x_{rx})$.

In FIG. 11, at position Tx1, Rx1, the misalignment between the transmit element 22 and its corresponding waveguide opening 60 is again reduced relative to position Tx2, Rx2, whereas the misalignment between the receive element 24 and its corresponding waveguide opening 60 is again increased. Similarly, at position Tx3, Rx3, the misalignment between the transmit element 22 and its corresponding waveguide opening 60 is again increased relative to position Tx2, Rx2, whereas the misalignment between the receive element 24 and its corresponding waveguide opening 60 is again reduced. Accordingly, it will again be appreciated that there is a tendency for reductions in the overall coupling factor resulting from misalignments relative to position Tx2, Rx2 to cancel out. Because of this, the aforementioned intentional increase in the lateral spacing between the waveguide openings 60 of the test apparatus 100 has led to an overall reduction in sensitivity of coupling factor to misalignments (relative to position Tx2, Rx2) between the waveguide openings 60 of the test apparatus 100 and those of the device 10 under test. Again, to a first order approximation, the overall coupling factors Tx1+Rx1≈Tx2-Rx2≈Tx3+Rx3. As with the embodiment of FIG. 10, this can therefore improve the accuracy and repeatability of tests on semiconductor devices 10 of the kind described herein, using a test apparatus 100 having a loop back waveguide arrangement.

The lateral spacing between the waveguide openings 60 of the test apparatus 100 may differ from (i.e. larger than or smaller than) the lateral spacing between the transmit and receive elements 22, 24 by an amount that may, for instance, be chosen according to the shape (e.g. slope, width etc.) of the coupling factor curves. Typically it is envisaged that the spacing between the waveguide openings 60 of the test apparatus 100 may larger than, or smaller, than the spacing between the corresponding transmit and receive elements 22, 24 of the device 10 by at least 0.1%, or by at least 1%.

According to embodiments of this disclosure, intentional smaller or larger lateral spacing between the waveguide openings may be employed in any test apparatus having:
  a test apparatus for testing the semiconductor device, the test apparatus comprising:
    a surface for placing against the surface of the device; and
    at least one waveguide, wherein each waveguide extends through the test apparatus for routing electromagnetic radiation transmitted by one of said transmit elements of the device to one of the receive elements of the device, wherein each waveguide comprises a plurality of waveguide openings for coupling electromagnetically to corresponding radiating elements of the plurality of radiating elements located at the surface of the device.

The test apparatus may, for instance, include a test apparatus of the kind described above in relation to any of FIGS. 1 to 7, although it is envisaged that the previously described dielectric portion 40 may, or may not be present in such embodiments.

The semiconductor device under test may comprise an integrated circuit and a plurality of external radiating elements located at a surface of the device, the external radiating elements including at least one transmit element and at least one receive element. By way of example, the device under test may be a device 10 of the kind described above in relation to any of FIGS. 1 to 7.

Testing of a semiconductor device 10 comprising an antenna in package (AiP) or Launcher in Package (LiP) such as those described in relation to FIG. 1 may generally not simply involve testing the radiating elements of the device 10. The testing may also involve testing any internal antenna of the device 10 (for instance the strip line antennae 12, 14 shown in FIG. 1B or the transmit and receive elements 32, 34 shown in FIG. 1C). The testing may also involve the so-called "artificial dielectric"—this are structures which make sure that the transmit and receive elements have the intended directional characteristics.

Temperature cycling, aging and/or production variations/defects may lead to defects which manifest in different ways. In some cases, the position of one of the transmit or receive elements of the device 10 may be shifted to a different position to that intended during manufacture. In more frequent cases, the geometrical antenna position may stay the same, but the apparent antenna position (i.e. the effective position according to the antenna directivity) may change. This can lead to the RF properties (e.g. gain, directivity) of the antennae of the device changing, as though the position of the antennae had changed, even though the actual positions of the antennae may remain unchanged. It is desirable that these effects are also accounted for during the loop back test procedure. Although it is desirable that these measurements be insensitive to misalignments of the test apparatus, it is also desired that they be sensitive to any changes (real or apparent) of the antennae themselves.

Figure 12:
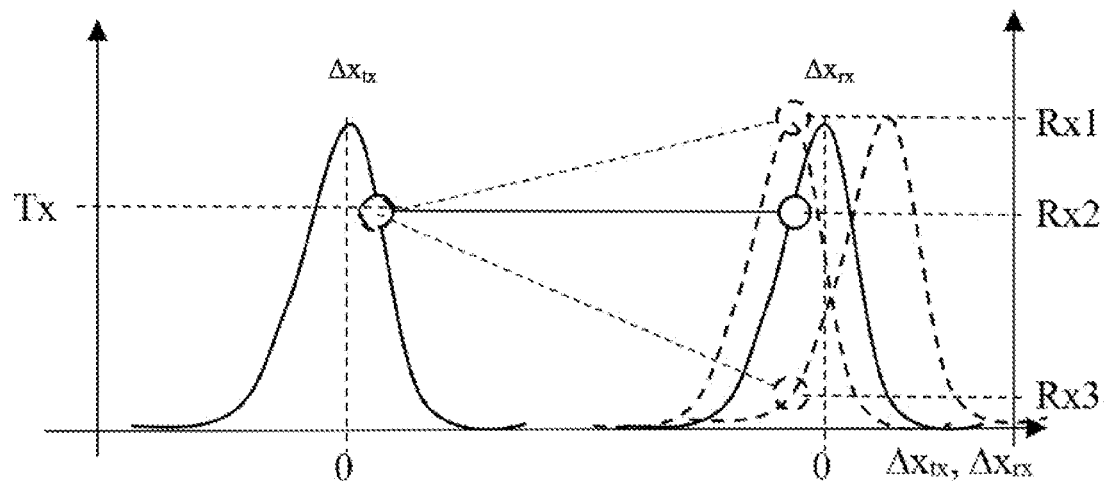

FIG. 12 shows the coupling factor between the transmit element 22 of a device 10 under test and its corresponding waveguide opening 60 in the test apparatus 100, and the coupling factor between the receive element 24 of the device 10 and its corresponding waveguide opening 60 in the test apparatus 100. In FIG. 12 it is assumed that the lateral spacing between the waveguide openings 60 in the test apparatus 100 is smaller than the lateral spacing between the transmit element 22 and the receive element 24 as described above in relation to FIG. 10.

In FIG. 12, position Tx, Rx2 is considered to be the "nominal" position, and corresponds to the position Tx2, Rx2 in FIG. 10. FIG. 12 also shows two example deviations from Tx, Rx2, namely Tx, Rx1 and Tx, Rx3. Tx, Rx1 and Tx, Rx3 each correspond to a change in lateral spacing (real or apparent) between the transmit and receive elements 22, 24 of the semiconductor device 10. In particular, in the case of Tx, Rx1, the lateral spacing between the transmit and receive elements 22, 24 is increased, whereas in the case of Tx, Rx3, the lateral spacing between the transmit and receive elements 22, 24 is decreased.

As can be seen, compared to Tx2, Rx2, a slight increase of the distance (Tx, Rx3) leads to worse coupling at the receive element 24. Likewise, a slight decrease of the distance (Tx, Rx1) leads to better coupling at the receive element 24. Hence, the change of the overall loopback transmission factor, Tx+Rx1, Tx+Rx3 versus the standard case Tx+Rx2, is large in this example (Tx+Rx1>>Tx+Rx2; Tx+Rx3<<Tx+Rx2). Accordingly, it will be appreciated that the sensitivity of the test procedure to variations in the lateral spacing in the radiating elements of the device 10 under test is generally large, notwithstanding the fact that the lateral spacing between the waveguide openings of the test apparatus 100 is intentionally different to the "nominal" spacing represented by Tx, Rx2. Although FIG. 12 has been explained under the assumption that the lateral spacing of the waveguide openings 60 is intentionally smaller than the lateral spacing of the transmit and receive elements 22, 24 of the device 10 under test (as per FIG. 10), it will be appreciated that the sensitivity of the test procedure to variations in the lateral spacing in the radiating elements of the device 10 under test will also generally be large for lateral spacings of the waveguide openings 60 that are intentionally larger than the lateral spacing of the transmit and receive elements 22, 24 of the device 10 under test (as per FIG. 11).

Accordingly, there has been described a method of testing a semiconductor device. An apparatus comprising a semiconductor device and a test apparatus. The semiconductor device includes an integrated circuit and a plurality of external radiating elements at a surface of the device, the radiating elements include transmit elements and receive elements. The test apparatus includes a surface for placing against the surface of the device. The test apparatus also includes at least one waveguide, which extends through the test apparatus for routing electromagnetic radiation transmitted by one of the transmit elements of the device to one of the receive elements of the device. Each waveguide comprises a plurality of waveguide openings for coupling electromagnetically to corresponding radiating elements of the plurality of radiating elements located at the surface of the device. A spacing between the waveguide openings of each waveguide is larger than, or smaller than a spacing between the corresponding radiating elements.

Although particular embodiments of this disclosure have been described, it will be appreciated that many modifications/additions and/or substitutions may be made within the scope of the claims.

What is claimed is:

1. An apparatus comprising:
a semiconductor device comprising an integrated circuit and a plurality of external radiating elements at a surface of the semiconductor device, the radiating elements including at least one transmit element and at least one receive element; and
a test apparatus for testing the semiconductor device, the test apparatus comprising:
a surface for placing against said surface of the semiconductor device; and
at least one waveguide, wherein each waveguide extends through the test apparatus for routing electromagnetic radiation transmitted by one of said transmit elements of the semiconductor device to one of the receive elements of the semiconductor device,
wherein each waveguide comprises a plurality of waveguide openings for coupling electromagnetically to corresponding radiating elements of the plurality of radiating elements located at the surface of the semiconductor device,
wherein a spacing between the waveguide openings of each waveguide of the test apparatus is larger than, or smaller than a spacing between the corresponding radiating elements of the semiconductor device, and
wherein at least one of the waveguides is configured to route electromagnetic radiation transmitted by one of said transmit elements of the semiconductor device to a plurality of receive elements of the semiconductor device, wherein said waveguide comprises:
a first branch for conveying electromagnetic radiation transmitted by said transmit element; and
at least two further branches coupled to the first branch for routing said electromagnetic radiation to said plurality of receive elements.

2. The apparatus of claim 1, wherein a spacing between the waveguide openings of each waveguide of the test apparatus is larger than, or smaller, than a spacing between the corresponding radiating elements of the semiconductor device by at least 0.1%.

3. The apparatus of claim 2, wherein a spacing between the waveguide openings of each waveguide of the test apparatus is larger than, or smaller than, a spacing between the corresponding radiating elements of the semiconductor device by at least 1%.

4. The apparatus of claim 1, wherein the spacing between the waveguide openings of each waveguide of the test apparatus is smaller than the spacing between the corresponding radiating elements of the semiconductor device.

5. The apparatus of claim 1, wherein the spacing between the waveguide openings of each waveguide of the test apparatus is larger than the spacing between the corresponding radiating elements of the semiconductor device.

6. The apparatus of claim 1, wherein the semiconductor device comprises a semiconductor die located in a package, and wherein the surface of the semiconductor device at which the plurality of external radiating elements are located is an external surface of the package.

7. The apparatus of claim 1, wherein the semiconductor device comprises:
   a semiconductor die located in a package; and
   a carrier, wherein the package is mounted on a carrier, wherein the surface of the semiconductor device at which the plurality of external radiating elements are located is a surface of the carrier.

8. The apparatus of claim 1, wherein the test apparatus further comprises a dielectric portion forming said surface for placing against said surface of the semiconductor device, wherein the dielectric portion is configured to provide a matched interface for said electromagnetic coupling of the plurality of waveguide openings to the plurality of radiating elements of the semiconductor device.

9. The apparatus of claim 8, wherein the dielectric portion has a thickness, measured between the plurality of radiating elements located at a surface of the semiconductor device and the plurality of waveguide openings, which is substantially equal to $\lambda/2$, where $\lambda$ is a wavelength of said electromagnetic radiation in the dielectric portion.

10. The apparatus of claim 8, wherein the dielectric portion comprises a curved surface for coupling electromagnetic radiation transmitted by a plurality of transmit elements of the semiconductor device to an opening of said plurality of waveguide openings.

11. The apparatus of claim 1, further comprising an attenuating portion located in at least one of said waveguides.

12. A method of testing a semiconductor device, the method comprising:
   providing a semiconductor device comprising an integrated circuit and a plurality of external radiating elements at a surface of the semiconductor device, the radiating elements including at least one transmit element and at least one receive element;
   providing a test apparatus for testing the semiconductor device, the test apparatus comprising:
      a surface for placing against said surface of the semiconductor device; and
      at least one waveguide, wherein each waveguide extends through the test apparatus for routing electromagnetic radiation transmitted by one of said transmit elements of the semiconductor device to one of the receive elements of the semiconductor device,
      wherein each waveguide comprises a plurality of waveguide openings for coupling electromagnetically to corresponding radiating elements of the plurality of radiating elements located at the surface of the semiconductor device,
      wherein a spacing between the waveguide openings of each waveguide of the test apparatus is larger than, or smaller than a spacing between the corresponding radiating elements of the semiconductor device, and
   transmitting electromagnetic radiation from at least one said transmit element to a plurality of said receive elements via at least one waveguide of the test apparatus, the at least one waveguide comprising a first branch for conveying electromagnetic radiation transmitted by said transmit element and at least two further branches coupled to the first branch for routing said electromagnetic radiation to said plurality of receive elements.

13. The method of claim 12, wherein a spacing between the waveguide openings of each waveguide of the test apparatus is larger than, or smaller than, a spacing between the corresponding radiating elements of the semiconductor device by at least 0.1%.

14. The method of claim 13, wherein a spacing between the waveguide openings of each waveguide of the test apparatus is larger than, or smaller than, a spacing between the corresponding radiating elements of the semiconductor device by at least 1%.

15. The method of claim 12, wherein the spacing between the waveguide openings of each waveguide of the test apparatus is smaller than the spacing between the corresponding radiating elements of the semiconductor device.

16. The method of claim 12, wherein the spacing between the waveguide openings of each waveguide of the test apparatus is larger than the spacing between the corresponding radiating elements of the semiconductor device.

17. The method of claim 12, wherein said transmitting electromagnetic radiation from at least one said transmit element to at least one said receive element via at least one waveguide of the test apparatus comprises at least one of the waveguides routing electromagnetic radiation transmitted by one of said transmit elements of the semiconductor device to a plurality of receive elements of the semiconductor device.

18. The method of claim 12, wherein the test apparatus further comprises a dielectric portion forming said surface for placing against said surface of the semiconductor device, wherein the dielectric portion provides a matched interface for said electromagnetic coupling of the plurality of waveguide openings to the plurality of radiating elements of the semiconductor device.

* * * * *